United States Patent
Jongman

(10) Patent No.: US 10,096,788 B2
(45) Date of Patent: Oct. 9, 2018

(54) REDUCING UNDESIRABLE CAPACITIVE COUPLING IN TRANSISTOR DEVICES

(71) Applicant: FLEXENABLE LIMITED, Cambridge (GB)

(72) Inventor: Jan Jongman, Cambridge (GB)

(73) Assignee: FLEXENABLE LIMITED, Cambridge (GB)

(*) Notice: Subject to any disclaimer, the term of this patent is extended or adjusted under 35 U.S.C. 154(b) by 0 days.

(21) Appl. No.: 15/100,527

(22) PCT Filed: Dec. 9, 2014

(86) PCT No.: PCT/EP2014/077086
§ 371 (c)(1),
(2) Date: May 31, 2016

(87) PCT Pub. No.: WO2015/086620
PCT Pub. Date: Jun. 18, 2015

(65) Prior Publication Data
US 2016/0308153 A1    Oct. 20, 2016

(30) Foreign Application Priority Data

Dec. 10, 2013  (GB) .................................. 1321797.1

(51) Int. Cl.
*H01L 27/088*    (2006.01)
*H01L 51/05*    (2006.01)
(Continued)

(52) U.S. Cl.
CPC ........ *H01L 51/055* (2013.01); *H01L 51/0023* (2013.01); *H01L 51/0512* (2013.01); *H01L 51/0541* (2013.01); *H01L 51/105* (2013.01)

(58) Field of Classification Search
CPC .............. H01L 51/055; H01L 51/0023; H01L 51/0541; H01L 51/105;
(Continued)

(56) References Cited

U.S. PATENT DOCUMENTS

2003/0001222 A1*  1/2003  Street ................ H01L 27/14643
                                                 257/444
2004/0105042 A1*  6/2004  Huang .............. G02F 1/136286
                                                 349/44
(Continued)

OTHER PUBLICATIONS

Written Opinion of the International Searching Authority of PCT/EP2014/077086 dated Feb. 17, 2015.
(Continued)

*Primary Examiner* — Eric Ward
*Assistant Examiner* — Eric Ashbahian
(74) *Attorney, Agent, or Firm* — Sughrue Mion, PLLC

(57) ABSTRACT

A transistor device comprising: source and drain conductors connected by a semiconductor channel; and a gate conductor capacitively coupled to the semiconductor channel via a gate dielectric; wherein the gate conductor comprises at least one portion overlapping at least part of at least one of said source and drain conductors; and further comprising a patterned insulator interposed between at least part of said at least one of the source and drain conductors and said at least one overlapping portion of said gate conductor so as to reduce capacitive coupling between the said at least one of the source and drain conductors and the gate conductor by more than any reduction in capacitive coupling between the semiconductor channel and the gate conductor.

17 Claims, 4 Drawing Sheets

(51) Int. Cl.
*H01L 51/00* (2006.01)
*H01L 51/10* (2006.01)

(58) Field of Classification Search
CPC .......... H01L 27/1214–27/1259; H01L 27/124; H01L 51/102; H01L 27/1244; G02F 1/1362–1/1368; G02F 1/136286; G02F 2001/136205; G01F 1/136286; G01F 1/13629; G01F 1/136295; G01F 1/1362–1/1368
USPC .......................................................... 257/24
See application file for complete search history.

(56) References Cited

U.S. PATENT DOCUMENTS

| 2006/0060855 | A1 | 3/2006 | Lee et al. | |
| 2006/0249817 | A1* | 11/2006 | Kawase | H01L 51/0022 257/622 |
| 2007/0170430 | A1* | 7/2007 | Nakagawa | G02F 1/136227 257/66 |
| 2008/0197348 | A1* | 8/2008 | Matsubara | H01L 27/283 257/40 |
| 2010/0032662 | A1 | 2/2010 | Whiting et al. | |
| 2010/0051922 | A1* | 3/2010 | Hotta | H01L 51/0541 257/40 |
| 2010/0127268 | A1* | 5/2010 | Daniel | H01L 51/0529 257/66 |
| 2013/0114017 | A1* | 5/2013 | Qin | G02F 1/1368 349/43 |
| 2013/0153903 | A1* | 6/2013 | Sung | H01L 51/0562 257/57 |
| 2014/0061615 | A1* | 3/2014 | Zhang | H01L 51/10 257/40 |

OTHER PUBLICATIONS

International Search Report of PCT/EP2014/077086 dated Feb. 17, 2015.

* cited by examiner

REDUCING UNDESIRABLE CAPACITIVE COUPLING IN TRANSISTOR DEVICES

CROSS REFERENCE TO RELATED APPLICATIONS

This application is a National Stage of International Application No. PCT/EP2014/077086 filed Dec. 9, 2014, claiming priority based on British Patent Application No. 1321797.1 filed Dec. 10, 2013, the contents of all of which are incorporated herein by reference in their entirety.

Capacitive coupling between the gate conductor and the source and/or drain conductors of a transistor device can be undesirable.

One way to reduce such coupling is to increase the thickness of the gate dielectric layer via which the gate conductor is capacitively coupled to the semiconductor channel in a device in which the gate dielectric also extends over the source/drain conductors.

The inventors for the present application have identified the challenge of developing a new way to reduce capacitive coupling between the gate conductor and the source and/or drain conductors.

There is hereby provided a transistor device comprising: source and drain conductors connected by a semiconductor channel; and a gate conductor capacitively coupled to the semiconductor channel via a gate dielectric; wherein the gate conductor comprises at least one portion overlapping at least part of at least one of said source and drain conductors; and further comprising a patterned insulator interposed between at least part of said at least one of the source and drain conductors and said at least one overlapping portion of said gate conductor so as to reduce capacitive coupling between the said at least one of the source and drain conductors and the gate conductor by more than any reduction in capacitive coupling between the semiconductor channel and the gate conductor.

According to one embodiment, the patterned insulator is interposed between said at least one of the source and drain conductors and said gate dielectric.

According to one embodiment, the patterned insulator is interposed between said at least part of said at least one of the source and drain conductors and a semiconductor layer providing said semiconductor channel.

There is also provided a transistor array comprising a plurality of transistor devices as described above, wherein the source and drain conductors for the plurality of transistor devices are defined by a patterned conductor layer, the semiconductor channels for the plurality of transistor devices are provided by a semiconductor layer, the gate dielectrics for the plurality of transistor devices are provided by a gate dielectric layer, and the gate conductors for the plurality of transistor devices are provided by another patterned conductor layer.

According to one embodiment, the patterned insulator is selectively provided over one or more portions of at least the source conductor relatively distant from the drain conductor.

There is also hereby provided a method of forming a transistor device, comprising: depositing a conductor layer on a substrate; depositing an insulator layer over the first conductor layer; patterning the insulator layer to define a mask for patterning the first conductor layer; patterning the first conductor layer using said mask to define source and drain conductors; retaining at least a portion of the patterned insulating layer on at least part of at least one of the source and drain conductors; forming a semiconductor layer over the substrate to form a semiconductor channel connecting the source and drain conductors; forming a gate dielectric over the semiconductor layer and the patterned insulating layer; and forming a gate conductor over the gate dielectric for capacitive coupling with the semiconductor channel.

According to one embodiment, the patterning of the insulating layer comprises creating a thickness profile in the insulating layer according to which the thickness of the insulator layer decreases towards at least neighbouring edges of said at least one of the source and drain conductors; and further comprising removing a surface portion of the patterned insulator layer after patterning the conductor layer, to expose upper surfaces of edge portions of said at least one of the source and drain conductors.

According to one embodiment, the method further comprises completely removing the patterned insulating layer from one or more portions of the source and drain conductors in closest proximity to each other, whilst retaining the patterned insulating layer on one or more portions of at least the source conductor relatively distant from the drain conductor.

One example of a technique according to an embodiment of the present invention is described hereunder, by way of non-limiting example only, with reference to the accompany drawings, in which.

An example of a technique according to the present invention is described below for an example of a transistor having interdigitated source/drain conductors having linear finger structures of the kind shown in FIG. 2, but the same technique may also be used for transistors having different architectures for the source/drain conductors such as, for example, a source conductor extending completely around a drain conductor.

Figure 1:
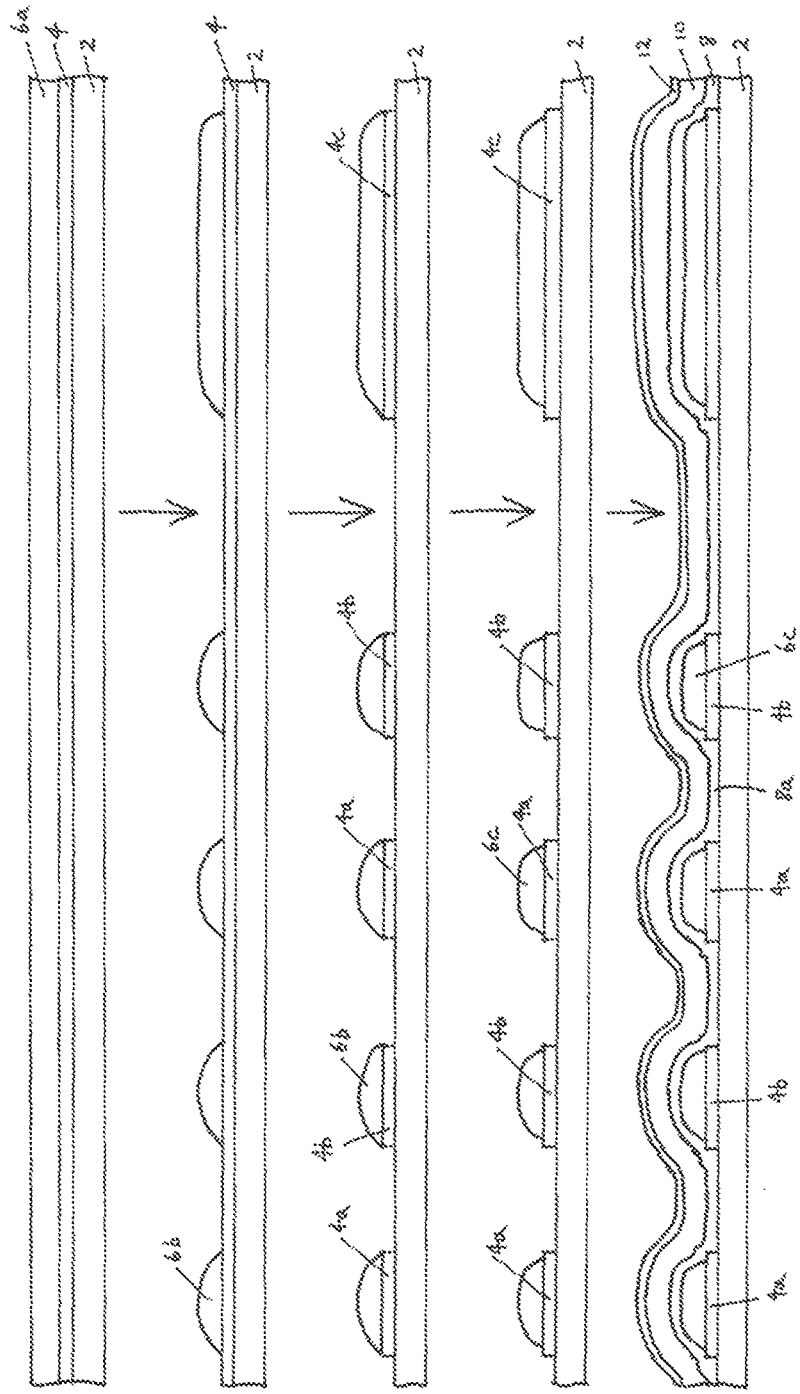
FIG. 1 is a schematic cross-sectional view illustrating a device incorporating an example of a technique for reducing capacitive coupling between the gate conductor and both source and drain conductors of a thin film transistor, and an example of a method of producing the same.
Figure 2:
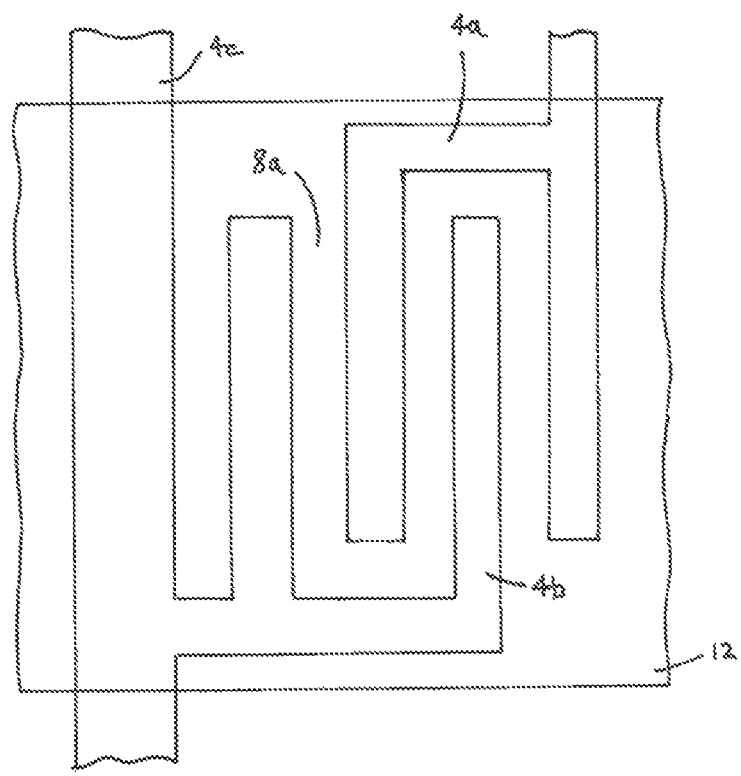
FIG. 2 is a schematic plan view of the source/drain conductors and overlying gate conductor of FIG. 1.

FIGS. 1 and 2 show only one transistor; but this technique is also applicable to transistor arrays comprising large numbers of transistors such as, for example, a typical pixelated display device comprising more than 1 million pixels each controlled by a respective transistor.

A continuous first conductor layer 4 is formed on a substrate 2 by e.g. a vapour deposition technique such as e.g. sputtering. A continuous layer of insulating photoresist material 6a of substantially uniform thickness is formed over the first conductor layer 4. The photoresist layer 6a is patterned according to a photolithographic technique involving using a mask to irradiate selected portions thereof and change the solubility of those portions in a developer solvent, and then developing the latent image by immersing the photoresist layer in a bath of the developer solvent. The photoresist material may be a negative photoresist material or a positive photoresist material. The photolithographic step is performed in such a way that the remaining portions of the photoresist layer (after development) exhibit a thickness profile according to which the thickness of the remaining photoresist portions 6b decreases towards the edges thereof, as shown schematically in FIG. 1. The desired thickness profile can be achieved, for example, by controlling the exposure/irradiation conditions, and the thickness profile can be altered after development by plasma etching.

The resulting structure is then subjected to etching to remove those portions of the first conductor layer 4 exposed by the photoresist pattern 6b, and thereby define the source and drain conductors 4a, 4b.

In this example, the remaining portions of the photoresist material (after development) are subjected after and/or before conductor etching to a plasma ashing process by which a surface portion of each remaining portion of photoresist 6b is removed, to selectively expose the upper surface of edge portions of the source/drain conductors 4a, 4b (using the thickness profile created in the remaining photoresist portions 6b by the photolithographic patterning). Increasing the area of the upper surface of the source/drain conductors exposed by e.g. plasma ashing can improve the injection of charge carriers into the semiconductor channel from the source/drain conductors, whilst still achieving some advantageous reduction in capacitive coupling between the source/drain conductors and the gate conductor. As discussed in more detail below, some advantageous reduction in capacitive coupling between the source/drain conductors and the gate conductor can be achieved even when completely removing the photoresist from some portions of the source and/or drain conductors.

A semiconductor material 8 is deposited over the resulting structure to form a semiconductor channel between the source and drain conductors 4a, 4b. The semiconductor material 8 is deposited to a thickness smaller than the combined thickness of the source/drain conductors and the remaining photoresist portions 6c (after development and plasma ashing). In this example, the semiconductor material 8 is deposited according to a process by which semiconductor channels of good thickness uniformity across and along the semiconductor channel 8a can be achieved despite the relatively rugged topographic profile created by the remaining photoresist portions 6c. Examples of preferred deposition techniques include slit coating, ink-jet printing and flexographic printing. For the example of an array of transistors discussed below, the semiconductor layer 8 may be patterned to e.g. better prevent leakage currents via the semiconductor between e.g. (i) drain conductors of adjacent transistors, (ii) a drain conductor of a transistor and a source conductor not associated with that transistor.

One or more gate dielectric materials 10 are then deposited over the resulting structure according to a technique, such as e.g. vapour deposition, slit coating, or flexographic printing, by which the topographic profile of the upper surface of the resulting structure reflects to at least some degree the topographic profile of the underlying structure.

A further conductor material is deposited over the resulting structure according to a substantially conformal deposition technique such as e.g. sputtering, and patterned by e.g. laser ablation or photolithography to define a gate conductor 12 overlapping both the whole area of the semiconductor channel and also the source/drain conductors 4a, 4b.

The retention of the photoresist portions 6c on the source/drain conductors 4a, 4b results in reduced capacitive coupling between the gate conductor 12 and the source/drain conductors 4a, 4b without any significant reduction in capacitive coupling between the gate conductor 12 and the semiconductor channel 8a.

A reduction in capacitive coupling between the gate conductor 12 and drain conductor 4a can be desirable for reducing the impact of a change in voltage at the gate conductor 12 (such as when the gate conductor 12 is switched between "off" and "on" voltages to switch the semiconductor channel 8a between low and high conductance states) on the voltage at the drain conductor 4a. Such changes in voltage at the gate conductor 12 can be large for some transistors such as those comprising some organic semiconductors for the semiconductor channel.

For devices comprising an array of transistors, the increased thickness of insulator between each drain conductor 4a and the gate conductors 12 further serves to reduce the variation across the array of transistors in the size of the impact of a change in voltage at a gate conductor 12 on the voltage at a drain conductor 4a. When the transistors of such a transistor array are used to control respective pixel portions of an optical media for a display device, this reduction in variation can lead to an increase in the uniformity of the optical output characteristic across the array of pixels.

As mentioned above, this technique of reducing the capacitive coupling between the drain conductor 4a and the gate conductor 12 is achieved without any significant reduction in the desirable capacitive coupling between the gate conductor 12 and the semiconductor channel 8a.

The increased thickness of insulator material between the source/drain conductors 4a, 4b and the gate conductor 12 also serves to reduce the risk of electrical shorts resulting from defects arising at the time of depositing the gate dielectric layer 10 (e.g. localised regions of reduced thickness within the gate dielectric layer 10) and/or defects arising during operation of the device such as localised breakdowns of the gate dielectric 10.

A reduction in capacitive coupling between a source conductor 4b and a gate conductor 12 can also be desirable for reducing the impact of a change in voltage at the gate conductor 12 (such as when the gate conductor is switched between "off" and "on" voltages to switch the semiconductor channel between low and high conductance states) on the voltage at the source conductor 4a. As mentioned above, such changes in voltage at a gate conductor 12 can be large for some transistors such as those comprising some organic semiconductors for the semiconductor channel. Predictable effects of changes in gate conductor voltage on the voltage at a source conductor can be compensated for by the one or more source driver chips (not shown) used to drive the source conductors in a transistor array, but this compensation can lead to efficiency losses and increased power consumption. Reducing the degree of compensation required by reducing the capacitive coupling between the source conductors 4a and the gate conductors 12 can reduce efficiency losses and reduce power consumption.

Figure 3:
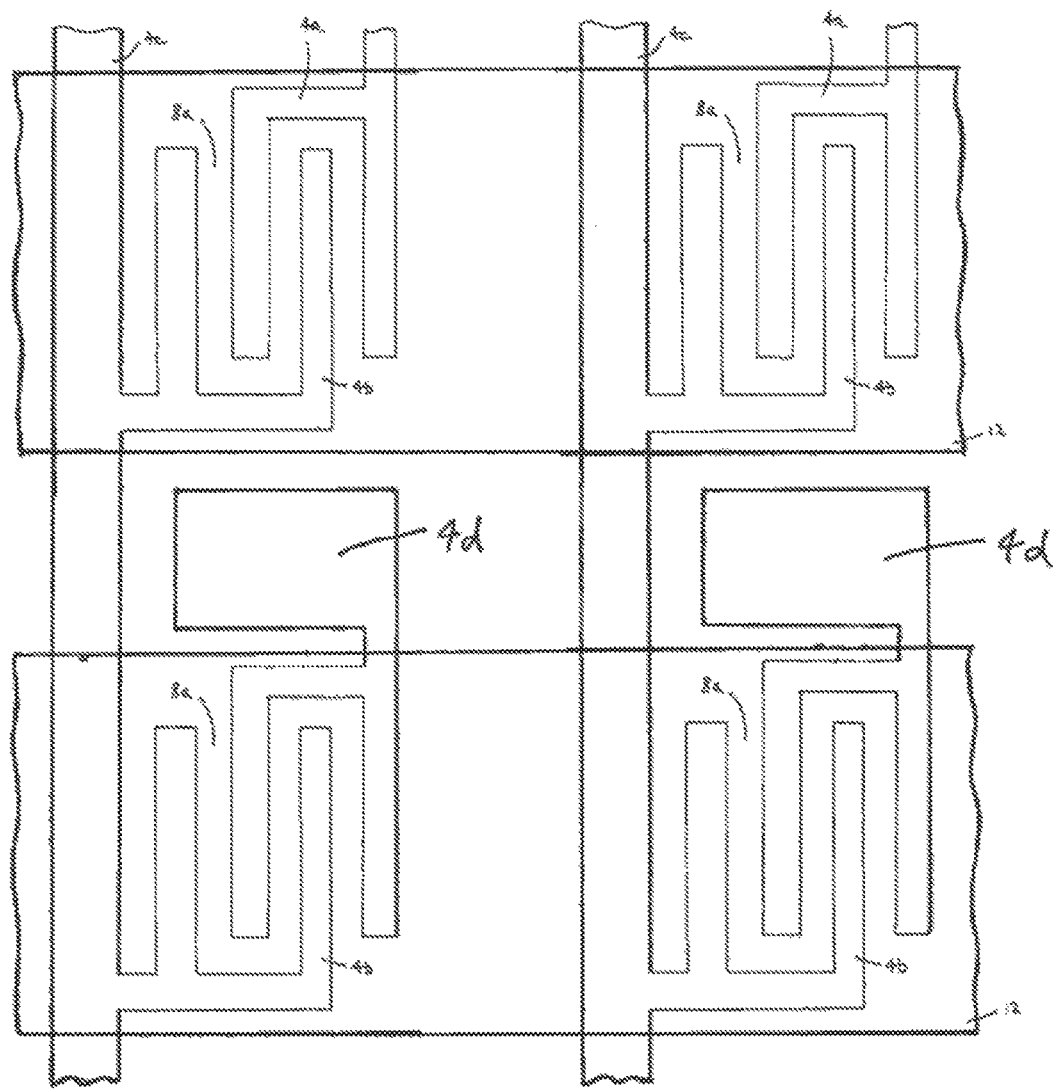
FIG. 3 is a schematic plan view illustrating an example of an array of transistors of the kind illustrated in FIG. 2.

For the example of a 2-dimensional array of transistors (such as the example illustrated in FIG. 3), the patterned first conductor layer defines an array of source conductors each providing the source electrodes for a respective row of transistors, and connected to a respective terminal of one or more source driver chips; and the patterned upper conductor layer defines an array of gate conductors, each providing the gate electrode for a respective column of transistors. Each source conductor comprises addressing portions 4c that are not adjacent any drain conductor or relatively distant from any adjacent drain conductor, but which function to create conductive connections between the portions of the source conductor in close proximity to the drain conductors of the respective row of transistors and a respective terminal of one or more source driver chips at one or more edge of the transistor array. Similarly, each gate conductor comprises addressing portions that do not overlap the semiconductor channels 8a between source and drain conductors for the respective column of transistors, but which function to create conductive connections between the portions of the gate conductors that do overlap the semiconductor channels, and a respective terminal of one or more gate driver chips at one or more edges of the transistor array. These addressing portions of the source and gate conductors will also overlap in some locations, and the retention of the insulating photoresist material also on the addressing portions of the source conductors reduces the risks of electrical shorting between these addressing portions of the source and gate conductors.

Figure 4:
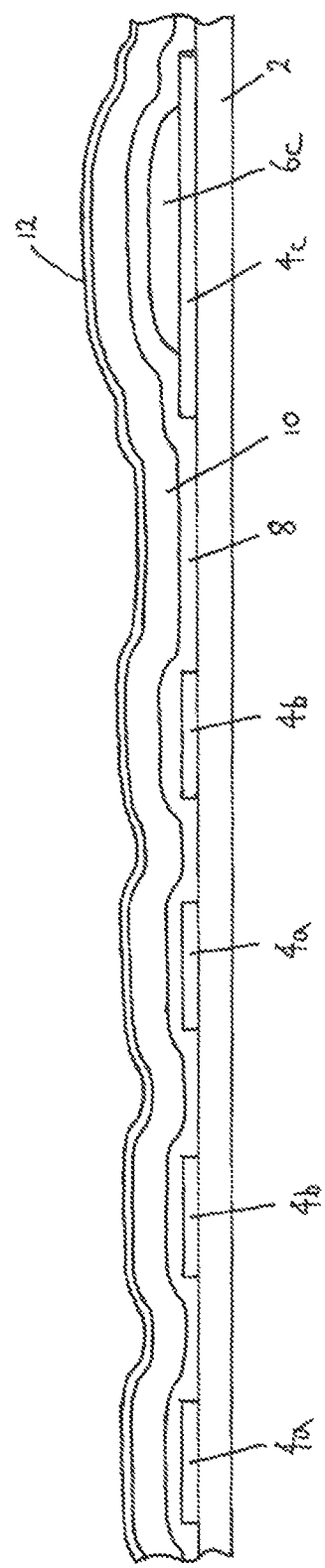
FIG. 4 is a schematic cross-sectional view illustrating a device incorporating a second example of a technique for reducing capacitive coupling between the gate conductor and source conductor of a thin film transistor.

The source conductors (and drain conductors) may include portions that are relatively distant from the semiconductor channel (between the parts of the source and drain conductors that are closest to each other), but may nevertheless overlap with an overlying gate conductor. Examples include e.g. parts of the above-mentioned addressing portion(s) 4c of a source conductor in an array of transistors. If these relatively distant portions are designed to have a relatively large width (such that the shortest distance between the centre of these portions to the closest edge thereof is relatively large) compared to the portions of the source and drain conductors that are closest to each other (e.g. the interdigitated fingers in FIGS. 2 and 3), then this facilitates the retention of photoresist on these relatively distant portions whilst completely removing resist from the portions of the source and drain conductors that are closest to each other. This can be advantageous for achieving better injection of charge carriers into the semiconductor channel from the source/drain conductors whilst still achieving an advantageous reduction in capacitance between the source and/or drain conductors and an overlapping gate conductor. This is shown schematically in FIG. 4 for the example of an addressing portion 4c of a source conductor having a greater width than that of the portion of the source conductor closest to a drain conductor.

The first conductor layer may itself have a multilayer structure comprising e.g. a layer of material chosen for its good electrical conductivity and a layer of material chosen for its good charge injection properties. The second conductor layer may also have a multilayer structure comprising e.g. a layer of material chosen for its good adhesion to the underlying gate dielectric, and a layer of material chosen for its good electrical conductivity.

The semiconductor layer and/or the gate dielectric layer may also comprise one or more materials and/or one or more sub-layers.

In the case of an example of a transistor array for a pixelated display device, a further insulating layer is then formed over the patterned second conductor layer defining the gate conductors; through holes are defined in at least the further insulating layer, the gate dielectric layer, the semiconductor layer and the photoresist layer down to a drain pad portion 4d of each drain conductor; and an additional conductor material is deposited in these through holes and over the further insulating layer, and then patterned to define an array of pixel conductors each conductively connected to a respective drain conductor.

In one example, the device includes further insulator and conductor layers between the pixel conductor layer and the gate conductor layer. For example, the device may include a screening, conductor layer which overlaps with the whole of the combined area of the pixel conductors and the whole of the combined area between the pixel conductors, except for through holes defined in the screening layer to accommodate the interlayer connects between the pixel conductors and the drain conductors. Such screening layer can function to reduce unpredictable capacitive coupling between the overlying pixel conductors and underlying conductors such as the gate conductors.

The conductor layers defining the source, drain and gate conductors may also define further conductive elements. For example, the conductor layer defining the gate lines 12 may also define common voltage lines (COM lines).

One example of a method of operating the device of this example, involves: driving the gate conductors sequentially at "on" voltages (whilst all other gate conductors are at "off" voltages), which "on" voltage increases the conductivity of the semiconductor channels of the respective column of transistors; and applying respective voltages to the source conductors to achieve the desired electric potential at the drain conductors (and therefore the pixel electrodes) of the transistors associated with the "on" gate conductor. Each transistor is associated with a respective unique combination of source and gate conductors, and the electric potential at the drain conductor of any transistor can thus be controlled independently of all other transistors in the array.

The example described above involves retaining on the source and drain conductors 4a, 4b portions of the photoresist material used as a mask to pattern the source and drain conductors. One example of an alternative technique involves removing all of the photoresist material 6 from over the source and drain conductors after patterning of the source and drain conductors is completed, and instead depositing a continuous layer of an additional material having better insulating properties than the photoresist material, and then patterning the additional insulating material so as to achieve the same kind of pattern as described above for the photoresist material 6c after development and plasma ashing. This alternative example requires accurate alignment with the patterned source/drain conductors 4a, 4b, 4c, 4d during the process of patterning the additional insulating layer, but has the advantage of being able to use an insulator material having better insulating properties than the photoresist material.

The drawings schematically illustrate the example of an architecture in which the addressing portion 4c of the source conductor extends in a direction substantially parallel to the interdigitated finger portions of the source conductor that are closest to the drain conductor; but the above-described technique is also applicable to other architectures such as, for example, one in which the addressing portion of the source conductor extends in a direction substantially perpendicular to the interdigitated finger portions of the source conductor.

In addition to the modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A device comprising:
   a first conductor pattern comprising conductive regions and non-conductive regions, and defining at least source and drain conductors of one or more transistors each comprising a semiconductor channel; and a second conductor pattern over the first conductor pattern and defining at least one or more gate conductors capacitively coupled to the one or more semiconductor channels via a gate dielectric, wherein there is overlap between the first and second conductor patterns in some regions, wherein the conductive regions of the first conductor pattern comprise addressing line portions and other portions of smaller width than the addressing line portions, and wherein the device further comprises a patterned insulator including portions interposed between said second conductor pattern and at least part of said addressing line portions, without any portion of said patterned insulator interposed between said second conductor pattern and said other portions of said first conductor pattern, or between said semiconductor channels and said second conductor pattern, or anywhere over said non-conductive regions; and wherein said patterned insulator is interposed between said first conductor pattern and said gate dielectric.

2. The device according to claim 1, wherein said other portions of said first conductor pattern comprise portions of the first conductor pattern in one or more regions where the source and drain conductors are closest to each other.

3. The device according to claim 1, wherein said other portions comprise one or more portions of the first conductor pattern defining interdigitated fingers.

4. The device according to claim 3, wherein said one or more gate conductors cover the whole of said interdigitated fingers.

5. The device according to claim 1, wherein said first conductor pattern defines drain pads connected via through holes in at least a further insulating layer to an array of pixel conductors.

6. A device comprising:
a first conductor pattern comprising conductive regions and non-conductive regions, and defining at least source and drain conductors of one or more transistors each comprising a semiconductor channel; and
a second conductor pattern over the first conductor pattern and defining at least one or more gate conductors capacitively coupled to the one or more semiconductor channels via a gate dielectric,
wherein there is overlap between the first and second conductor patterns in some regions,
wherein the conductive regions of the first conductor pattern comprise addressing line portions and other portions of smaller width than the addressing line portions, and
wherein the device further comprises a patterned insulator including portions interposed between said second conductor pattern and at least part of said addressing line portions, without any portion of said patterned insulator interposed between said second conductor pattern and said other portions of said first conductor pattern, or between said semiconductor channels and said second conductor pattern, or anywhere over said non-conductive regions; and wherein said patterned insulator is interposed between said first conductor pattern and a semiconductor layer providing said one or more semiconductor channels.

7. The device according to claim 6, wherein said other portions of said first conductor pattern comprise portions of the first conductor pattern in one or more regions where the source and drain conductors are closest to each other.

8. The device according to claim 6, wherein said other portions comprise one or more portions of the first conductor pattern defining interdigitated fingers.

9. The device according to claim 8, wherein said one or more gate conductors cover the whole of said interdigitated fingers.

10. The device according to claim 6, wherein said first conductor pattern defines drain pads connected via through holes in at least a further insulating layer to an array of pixel conductors.

11. A method, comprising:
depositing a conductor layer on a substrate;
depositing an insulator layer over the first conductor layer;
patterning the insulator layer to define a mask for patterning the first conductor layer;
patterning the first conductor layer using said mask to form a first conductor pattern defining at least source and drain conductors for one or more transistors,
wherein the first conductor pattern defines first portions having a greater width than other, second portions thereof;
retaining the patterned insulating layer on at least part of said first portions of said first conductor pattern without retaining said patterned insulating layer on any part of said second portions of the first conductor pattern;
forming a semiconductor layer over the substrate to form one or more semiconductor channels of the one or more transistors;
forming a gate dielectric over the semiconductor layer and the patterned insulating layer; and
forming a second conductor pattern over the gate dielectric defining one or more gate conductors for capacitive coupling with the one or more semiconductor channels.

12. The method according to claim 11, wherein said first portions comprises addressing lines.

13. The method according to claim 11, comprising subjecting the patterned insulating layer to a treatment by which the patterned insulating layer is completely removed from the second portions of the first conductor pattern while retaining part of said patterned insulating layer on at least part of said first portions of the first conductor pattern.

14. The method according to claim 11, wherein said second portions of the first conductor pattern comprise portions of the first conductor pattern where the source and drain conductors are closest to each other.

15. The method according to claim 11, wherein said second portions of the first conductor pattern comprise portions of the first conductor pattern defining interdigitated fingers.

16. The method of claim 15, wherein said one or more gate conductors cover the whole of said interdigitated fingers.

17. The method according to claim 11, wherein said first conductor pattern comprises drain pad portions, and wherein the method further comprises forming at least one further insulating layer over said second conductor pattern, forming through holes at least in said at least one further insulating layer extending down to said drain pad portions, and forming an array of pixel conductors over said at least one further insulating layer connected to said drain pad portions via said through holes.

* * * * *